United States Patent [19]
Nakamura et al.

[11] Patent Number: 4,954,417
[45] Date of Patent: Sep. 4, 1990

[54] LIGHT-SENSITIVE MICROCAPSULE CONTAINING POLYMERIZABLE COMPOUND AND SILVER HALIDE, AND LIGHT-SENSITIVE MATERIAL EMPLOYING THE SAME

[75] Inventors: Taku Nakamura; Tsumoru Hirano; Eiji Funatsu; Shunichi Ishikawa, all of Minami-ashigara, Japan

[73] Assignee: Fuji Photo Film Co., Ltd., Kanagawa, Japan

[21] Appl. No.: 336,491

[22] Filed: Apr. 11, 1989

Related U.S. Application Data

[63] Continuation of Ser. No. 933,510, Nov. 21, 1986, abandoned.

[30] Foreign Application Priority Data

Nov. 21, 1985 [JP] Japan ............................... 60-261888
Jan. 22, 1986 [JP] Japan ............................... 61-11556

[51] Int. Cl.$^5$ .................................................. G03C 1/72
[52] U.S. Cl. .................................... 430/138; 430/217; 430/270; 430/231; 430/435; 430/367

[58] Field of Search ............... 430/138, 281, 270, 435, 430/203, 217

[56] References Cited

U.S. PATENT DOCUMENTS

| | | | |
|---|---|---|---|
| 3,396,026 | 8/1968 | Taylor | 430/138 |
| 3,443,948 | 5/1969 | Bryan | 430/138 |
| 3,505,068 | 4/1970 | Beckett et al. | 430/138 |
| 3,694,252 | 9/1972 | Gerber et al. | 430/138 |
| 3,694,253 | 9/1972 | Gerber et al. | 430/138 |
| 4,636,453 | 1/1987 | Keys et al. | 430/138 |

Primary Examiner—Jack P. Brammer
Attorney, Agent, or Firm—Sughrue, Mion, Zinn, Macpeak & Seas

[57] ABSTRACT

A light-sensitive microcapsule comprising a core material containing a polymerizable compound and a shell material characterized in that the shell material contains therin silver halide in the form of grains. A light-sensitive material comprising a light-sensitive layer containing a great number of said microcapsules and a reducing agent provided on a support is also disclosed.

8 Claims, No Drawings

LIGHT-SENSITIVE MICROCAPSULE CONTAINING POLYMERIZABLE COMPOUND AND SILVER HALIDE, AND LIGHT-SENSITIVE MATERIAL EMPLOYING THE SAME

This is a continuation of application Ser. No. 06/933,510, filed Nov. 21, 1986, now abandoned.

BACKGROUND OF THE INVENTION

1. Field of the Invention

This invention relates to an improvement of a light-sensitive microcapsule containing a polymerizable compound, and a light-sensitive material employing the same.

2. Description of Prior Arts

Light-sensitive materials comprising a light-sensitive layer containing silver halide, a reducing agent and a polymerizable compound provided on a support have been used in the image forming method in which a latent image of silver halide is formed, and then the polymerizable compound is polymerized to form the corresponding image.

Examples of said image forming method are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and 61(1986)-73145 (the contents of both publications are described in U.S. Pat. Ser. No. 775,273 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the content of the three publications are shown in U.S. Pat. Ser. No. 827,702).

The above-mentioned image forming methods are based on the principle in which the polymerizable compound is polymerized in the portion where a latent image of the silver halide has been formed.

Further, Japanese Patent Application No. 60(1986)-210657 describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polmerizable compound in the other portion is polymerized.

In the light-sensitive materials which may be used for the above-mentioned image forming methods, the polymerizable compound can be contained in a microcapsule. The light-sensitive material employing the microcapsule is described in Japanese Patent Application No. 60(1985)-117089 (corresponding to U.S. Pat. Ser. No. 868,385). The light-sensitive material containing such microcapsules has an advantage in that an image improved in the sharpness can be obtained.

SUMMARY OF THE INVENTION

An object of the present invention is to provide a light-sensitive microcapsule having improved sensitivity.

Another object of the invention is to provide a light-sensitive material which is improved in sensitivity and gives an image of improved sharpness.

There is provided by the present invention a light-sensitive microcapsule comprising a core material containing a polymerizable compound and a shell material characterized in that the shell material contains silver halide.

The light-sensitive microcapsule of the invention is characterized in that the microcapsule contains silver halide in the shell portion.

The microcapsule of the invention shows very high light-sensitivity, because silver halide serves as a light sensor and further the silver halide is located in the shell material where the light-sensitive silver halide can easily and efficiently be exposed to a light applied to the surface of the microcapsule.

Further, in the case that unhardened microcapsules are destroyed for releasing the core material containing a polymerizable compound, most of the silver halide is retained within the shell material portion and is hardly released at the time when the core material is released. Therefore, it is easy to recover expensive silver. Moreover, the released material is scarcely stained with a silver compound which is possibly produced if a silver halide in the released material is afterwards exposed to light.

The above effects are very advantageous especially in the case that the light-sensitive microcapsule is employed in the light-sensitive material.

Accordingly, the light-sensitive microcapsule of the present invention is preferably used in a light-sensitive material comprising a light-sensitive layer containing a great number of the above microcapsules and a reducing agent which is provided on a support.

In the light-sensitive material employing the microcapsule of the present invention, the silver halide and the polymerizable compound are located very closely to each other. Thus, the reaction to accelerate (or inhibit) the polymerization in the portion where a latent image of silver halide has been formed can smoothly progress, and the contrast between the latent image portion and the other portion is made prominently high. Therefore, using the light-sensitive material employing the microcapsule of the invention, a remarkably sharp image can be obtained.

DETAILED DESCRIPTION OF THE INVENTION

The shell material containing silver halide and the core material containing a polymerizable compound which together constitute the light-sensitive microcapsule of the invention are described below.

There is no specific limitation with respect to silver halide contained in the shell material of the light-sensitive microcapsule.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains employed in the light-sensitive microcapsule ordinarily have a mean size of 0.001 to 5 μm, more preferably 0.001 to 2 μm.

There is also no specific limitation on shell material per se of the microcapsule of the invention, except that the shell material of the invention contains silver halide. Various known materials such as polymers which are employed in the conventional microcapsules can be employed as the shell material.

The silver halide is contained in the shell material of the microcapsule in the invention. Further, silver halide may be also contained in the core material. The content of silver halide in the core material is preferably not more than 30% by weight, more preferably not more than 10% by weight, of the amount of the silver halide contained in the shell material. The ratio of silver halide contained in the shell material can be easily determined by destroying the microcapsule to release the core material and then measuring the silver halide content of the released material.

There is no specific limitation with respect to the polymerizable compound, and any known polymerizable compounds including monomers, oligomers and polymers can be contained in the core material of the light-sensitive microcapsule of the invention. In the case that heat development (i.e., thermal development) is utilized for developing the light-sensitive microcapsule or the light-sensitive material employing the same, the polymerizable compounds having a relatively higher boiling point (e.g., 80° C. or higher) that are hardly evaporated upon heating are preferably employed. In the case that the light-sensitive microcapsule or the light-sensitive material contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive microcapsule of the invention are described in the above-mentioned and later-mentioned publications and applications concerning the light-sensitive material.

Preferred polymerizable compounds employable for the light-sensitive microcapsule are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamides, maleic anhydride, maleic ester, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive microcapsules employing these compounds which show functions as both the reducing agent and the polymerizable compound, or of the color image forming substance and the polymerizable compound are included in embodiments of the invention.

The amount of the polymerizable compound for incorporation into the core material of the light-sensitive microcapsule preferably ranges from 5 to $1.2 \times 10^5$ times (by weight) as much as the amount of silver halide, more preferably from 10 to $1 \times 10^4$ times as much as the silver halide.

There is also no specific limitation with respect to the core material per se of the microcapsule, except that the core material can contain the polymerizable compound. The core material can be composed of the polymerizable compound alone. In the core material, other materials such as a solvent which has been used in the preparation of the microcapsule may remain.

The light-sensitive microcapsule of the invention can further contain optional components such as reducing agents, color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

The light-sensitive microcapsule of the invention composed of the above-mentioned components can be used in a variety of arts. Particularly, the light-sensitive microcapsule of the invention is preferably employed for the preparation of a light-sensitive material.

In the case that the light-sensitive microcapsule is used for a light-sensitive material, the above-mentioned optional components can be arranged outside of the microcapsule in the light-sensitive layer of the material. Details of the optional components will be hereinafter given in descriptions with respect to the light-sensitive material employing the microcapsule of the invention.

The mean size of the microcapsule preferably ranges from 0.5 to 50 μm, more preferably 1 to 25 μm, most preferably 3 to 20 μm.

The light-sensitive microcapsule of the invention can be prepared, for instance, by the following process.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746. When the organic silver salts are introduced in the light-sensitive microcapsule, the emulsion of the organic silver salts can be prepared in the same manner as in the preparation of the silver halide emulsion.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispresed state. Further, the polymer has another function of gathering silver halide along the interface between the polymerizable compound (i.e., the light-sensitive composition) and the aqueous medium in preparation of the microcapsule. Therefore, using this polymer, silver halide can be easily introduced into the shell material of the microcapsule.

The polymer which can be used in preparation of the light-sensitive composition has a principal chain consisting essentially of a hydrocarbon chain substituted in part with hydrophilic groups which contain, in their terminal groups, —OH or nitrogen having a lone electronpair.

The number of hydrophilic groups in the polymer can be chosen in consideration of the solubility of the polymer in the polymerizable compound and the dispersing ability for the silver halide. In the case that the polarity of the polymerizable compound is high, the number of hydrophilic groups in the polymer can be increased. In the case that the polarity of the polymerizable compound is low, the number of hydrophilic groups is preferably made small. Generally, the hydrophilic groups in the polymer are preferably present in number of at least 0.25% based on the number of carbon atoms contained in the principal chain. The hydrophilic groups are more preferably present in number of at least 0.5%, and most preferably present in number of at least 1%.

Examples of the terminal groups of the hydrophilic groups of the polymer include those of the following formula (I):

  (I)

in which each of $R^1$ and $R^2$ individually is hydrogen or a substituent group, and $R^1$ and $R^2$ totally contain not more than 5 carbon atoms.

Examples of the $R^1$ and $R^2$ in the formula (I) individually include —$COR^3$ in which $R^3$ is a substituent group containing not more than 4 carbon atoms, —$SO_2R^4$ in which $R^4$ is a substituent group containing not more than 5 carbon atoms, an alkyl group containing not more than 5 carbon atoms, and a substituted alkyl group containing not more than 5 carbon atoms.

Alternatively, $R^1$ and $R^2$ can form, together with the neighboring nitrogen, a 5- or 6-membered heterocyclic group.

Examples of the 5- or 6-membered nitrogen-containing heterocyclic group are described below.

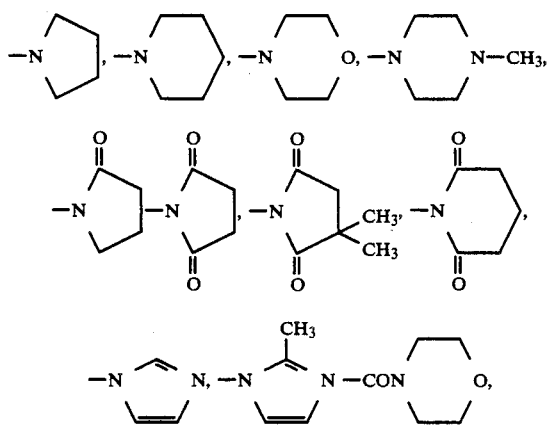

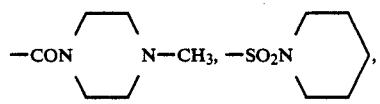

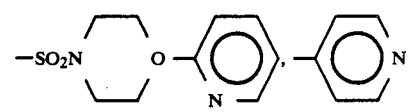

The repeating unit can be a repeating unit having a hydrophilic group which has the formula (II):

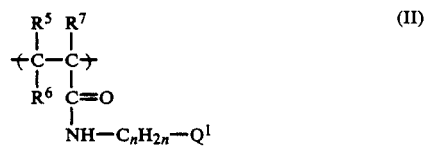  (II)

in which each of $R^5$, $R^6$ and $R^7$ individually is hydrogen or methyl; n is an integer of 1 to 6; and $Q^1$ is a monovalent group selected from the group consisting of hydroxyl, amino, an amino group substituted with one or two alkyl groups containing 1–6 carbon atoms, hydroxyphenyl, a 5- or 6-membered nitrogen-containing heterocyclic group, —$COCH_3$ and —$NHSO_2CH_3$.

The repeating unit can be a repeating unit having a hydrophilic group which has the formula (III):

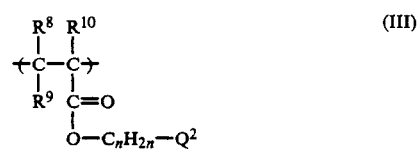  (III)

in which each of $R^8$, $R^9$ and $R^{10}$ individually is hydrogen or methyl; n is an integer of 1 to 6; and $Q^2$ is a monovalent group selected from the group consisting of hydroxyl, amino, an amino group substituted with one or two alkyl groups totally containing 1–5 carbon atoms, hydroxyphenyl, a 5- or 6-membered nitrogen-containing heterocyclic group and —$NHSO_2CH_3$.

In the formulas (II) and (III), n preferably is the integer of 2, 3 or 4; $Q^1$ preferably is a monovalent group such as hydroxyl, dimethylamino and —$COCH_3$; and $Q^2$ preferably is hydroxyl or dimethylamino.

Examples of the repeating units for constituting the polymers which are preferably used in the invention will be described hereinafter.

  (P-1)

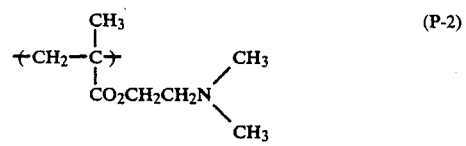  (P-2)

-continued

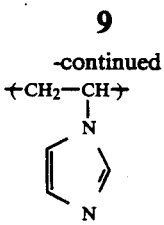 (P-3)

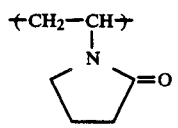 (P-4)

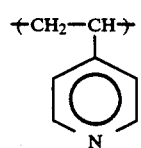 (P-5)

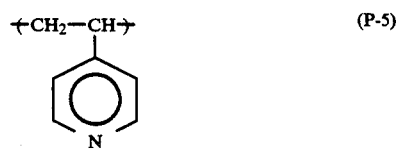 (P-6)

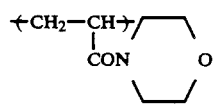 (P-7)

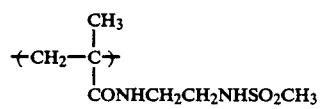 (P-8)

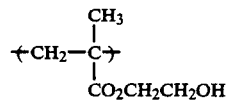 (P-9)

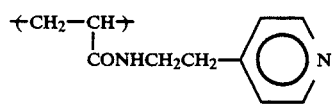 (P-10)

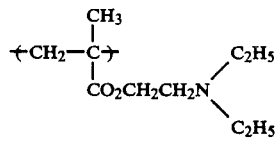 (P-11)

The polymer may be a copolymer comprising repeating units derived from a hydrophobic monomer in addition to repeating units having the hydrophilic group. The hydrophobic monomer preferably is an ethylenic unsaturated monomer having no hydrophilic group, such as an olefin, a vinyl ether, a vinyl ester, styrene, an acrylic ester, a methacrylic ester, an itaconic ester or a maleic ester.

Examples of the ethylenic unsaturated monomer include ethylene, butadiene, isobutylene, acrylonitrile, methyl vinyl ether, vinyl benzyl ether, vinyl acetate, vinyl propionate, styrene, vinyltoluene, chloromethylstyrene, p-chlorostyrene, methyl acrylate, ethyl acrylate, n-butyl acrylate, isobutyl acrylate, n-hexyl acrylate, cyclohexyl acrylate, 2-ethylhexyl acrylate, benzyl acrylate, tetrahydrofurfuryl acrylate, 2-methoxyethyl acrylate, methyl methacrylate, ethyl methacrylate, n-butyl methacrylate, isobutyl methacrylate, n-hexyl methacrylate, cyclohexyl methacrylate, 2-ethylhexyl methacrylate, benzyl methacrylate, tetrahydrofurfuryl methacrylate, furfurylmethacrylate, phenyl methacrylate, 2-methoxyethyl methacrylate, diethyl itaconate and dibutyl maleate. An ester of acrylic acid or mathacrylic acid and an alkyl alcohol containing 1-6 carbon atoms or the cycrohexyl alcohol is most preferred.

Examples of the repeating units of the copolymers which are preferably used as the above-mentioned polymers be described hereinafter. In each formula, the repeating unit on the left side corresponds to the unit having hydrophilic group, and the repeating unit on the right side corresponds to the unit having hydrophobic group.

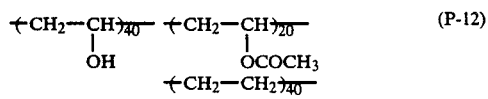 (P-12)

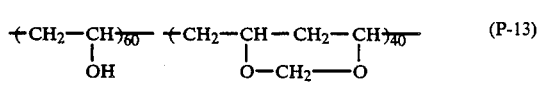 (P-13)

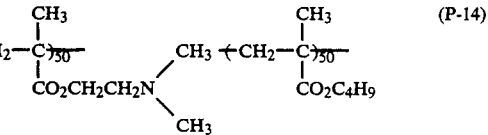 (P-14)

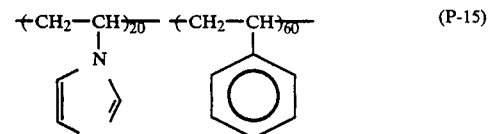 (P-15)

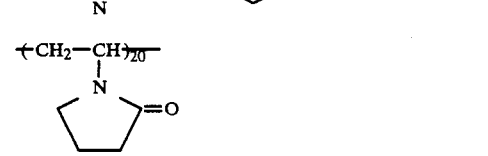 (P-16)

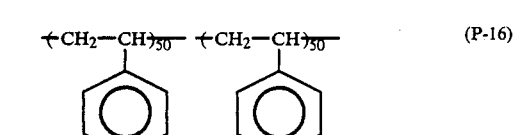 (P-17)

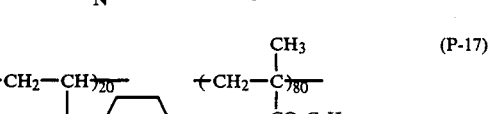 (P-18)

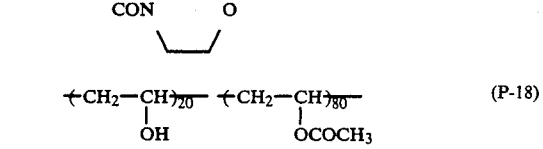 (P-19)

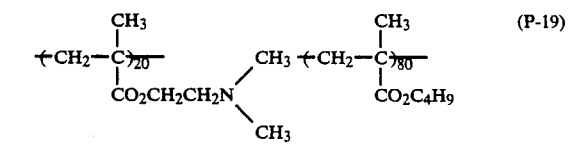 (P-20)

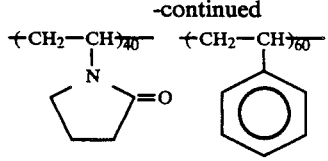 (P-21)

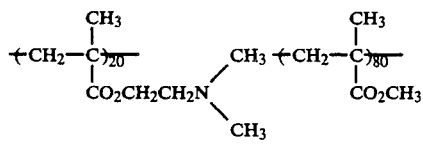 (P-22)

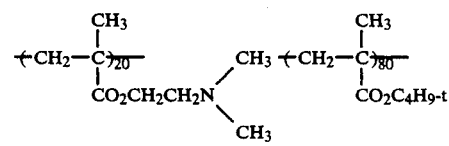 (P-23)

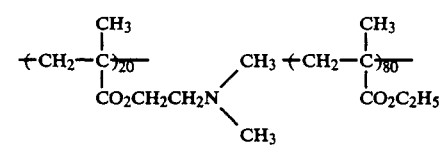 (P-24)

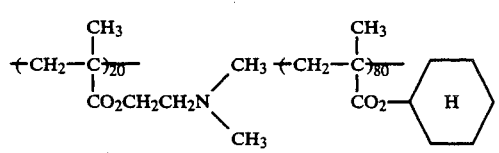 (P-25)

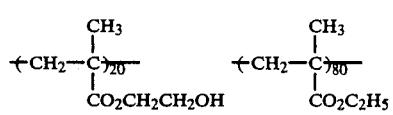 (P-26)

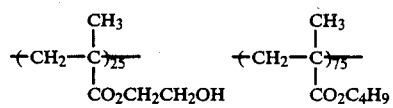 (P-27)

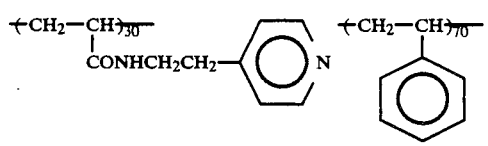 (P-28)

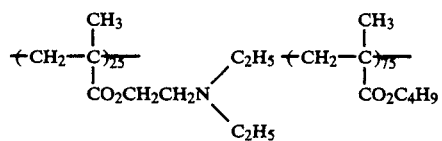 (P-29)

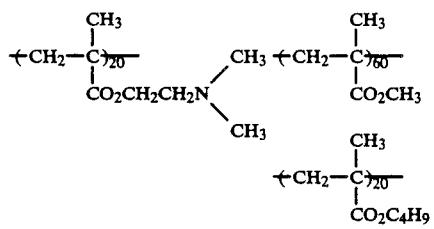 (P-30)

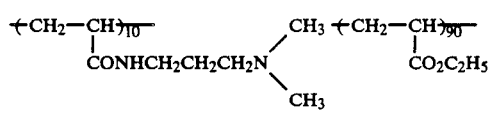 (P-31)

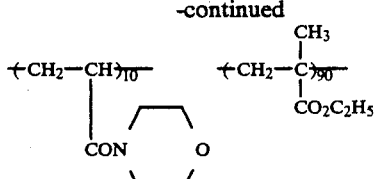 (P-32)

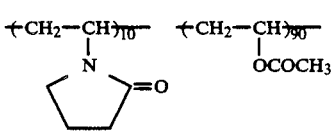 (P-33)

A preferred molecular weight of the polymer can be determined from the viewpoints of the viscosity and the dispersing ability of the solution wherein the polymer is dissolved in the polymerizable compound which serves as solvent or dispersing medium in the composition of the invention. Namely, the following should be considered for the determination of the molecular weight of the polymer: in the case that the molecular weight is too large, it may be difficult to stir sufficiently the solution in order to disperse silver halide in the composition because of the high viscosity of the solution, and that in the case that the molecular weight is too small, the dispersing ability for the silver halide is poor. The molecular weight of the polymer ordinarily ranges from 5,000 to 10,000,000, and preferably ranges from 10,000 to 2,000,000.

The amount of the polymer preferably ranges from 0.1 to 20 weight % based on the silver halide emulsion, more preferably from 0.1 to 10 weight %, and most preferably from 0.5 to 5 weight %.

Some polymers as defined above are commercially available. Such and other polymers can be prepared by polymerization of the aforementioned monomers. The polymers can be also prepared by modification of various polymers using, for instance, hydrolysis or acetylation.

Further, optional components, such as the reducing agents, the color image forming substances may dissolved, emulsified or dispersed in the light-sensitive composition. Furthermore, the necessary components for preparation of the microcapsule, such as shell wall-forming materials can be incorporated into in the light-sensitive composition.

The light-sensitive composition are preferably emulsified in an aqueous medium to prepare the microcapsule in the invention. The necessary components for preparation of the microcapsule, such as shell materials can be incorporated into the emulsion. Further, other components such as the reducing agent can be added to the emulsion.

The emulsion of the light-sensitive composition is processed for forming shell of the microcapsule. In the processes of emulsifying the light-sensitive composition and forming the shell of the microcapsule, silver halide is apt to be gathered on the interface between the the light-sensitive composition and the aqueous medium to introduce silver halide into the shell material of the microcapsule by the function of the aforementioned polymer.

Examples of the process for the preparation of the microcapsules include a process utilizing coacervation of hydrophilic wall-forming materials as described in U.S. Pat. Nos. 2,800,457 and 2,800,458; and interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the light-sensitive microcapsule of the invention can be obtained. Further, the medium of the dispersion can be removed by evaporation or filtration to separate the microcapsule of the invention.

Use of the light-sensitive microcapsule is described below.

The light-sensitive microcapsule of the present invention can be used in various fields of art. In these cases, the core material generally contains other components. Examples of these components include organic or inorganic materials, such as agricultural chemicals, catalysts, bonding agents, hardening agents, oxidizing agents, plasticizers, flocculating agents for high molecular compound, antioxidants, etc. in solid or liquid state.

In the case that the light-sensitive material is prepared using the microcapsule of the invention, a solution for forming a light-sensitive layer can be prepared by dispersing the microcapsules in an appropriate medium. The aforementioned aqueous dispersion of the microcapsules in which the microcapusles are in-situ produced can be used directly for the formation of a light-sensitive layer. Further, other optional components can be added to the dispersion.

A light-sensitive material of the invention can be prepared by coating and drying the above-prepared coating solution on a support in the conventional manner.

The light-sensitive material employing the above-mentioned light-sensitive microcapsule is described below.

In the light-sensitive material, a light-sensitive layer containing said microcapsule and a reducing agent is provided on a support. Thus composed material is referred hereinafter to as "light-sensitive material".

The total silver content (including silver halide and an organic silver salt which is one of optional components) in the light-sensitive layer preferably is in the range of from 0.1 mg to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive microcapsule or material has a function of reducing the silver halide and/or function of accelerating or restraining a polymerization of the polymerizable compound. Examples of the reducing agents having these functions includes various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has been not formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (June 1978), and Research Disclosure No. 17643, 22-31 (Dec. 1978). The reducing agents described in the these publications and applications can be employed in the light-sensitive microcapsule and material of the present invention. Thus, "the reducing agent(s)" in the present specification means to include all of the reducing agents described in the above-mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has been occurred in practical use.

These reducing agents can be contained in the microcapsule or arranged outside of the microcapsule in the light-sensitive layer. Generally, the reducing agent is preferably contained in the microcapsule, because the reaction can progress smoothly in such case. The reducing agent is more preferably dispersed or dissolved in the core material containing the polymerizable compound. In the case that heat development is utilized in the use of the light-sensitive material, there is no problem in arranging the reducing agent outside of the microcapsule, because the reducing agent can permeate the microcapsule to reach the core material.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p-or o-aminophenyl)hydrazine, 1-acetyl-2-(p- or o-methoxyphenyl)-hydrazine, 1-lauroyl-2-(p-or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p-or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]-hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2 -(2,4-ditert-pentylphenoxy)-butylamide}phenyl]hydrazine, 1-acetyl-2-[4-{2-(2,4-ditert-pentylphenoxy)butylamido}phenyl]-hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl} phenyl]hydrazine.

The amount of the reducing agent in the light-sensitive layer preferably ranges from 0.1 to 1500 mole % based on the amount of silver (contained in the above-mentioned silver halide and organic silver salt).

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various components which may be contained in the light-sensitive microcapsule or the light-sensitive layer, and auxiliary layers which may be optionally arranged on the light-sensitive materials are described below.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion.

Examples of the substnces which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to 80 parts by weight per one part by weight of the color former.

There is no specific limitation with respect to about the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. The light-sensitive material wherein the sensitizing dye has been added during the silver halide grain formation is described in Japanese Patent Application No. 60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\mu$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazoles) which can form an organic silver salt in combination with an inorganic silver salt can be added to the light-sensitive layer to obtain the same effect. The light-sensitive material employing an organic silver salt is described in Japanese Patent Application No. 60(1985)-141799.

A wide variety of image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a like function. The image formation accelerators can be classified into inorganic bases, organic bases, base precursors, oils, surface active agents, compounds having function as antifogging agent and/or development accelerator, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 8 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds having function as antifogging agent and/or development accelerator can be used for the purpose of obtaining a clear image having high contrast, namely, having large maximum density and small minimum density.

The hot-melt solvents preferably are compounds which may be used for solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U. S. Pat. No. 3,667,959; and 1,10-decanediol, methyl anisate and biphenyl suberate described in Research Disclosure 26–28 (Dec. 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Application No. 60(1985)-210657.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 59(1984)-85834. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in United Kingdom Patent No. 12,322,347; polymer particles described in U.S. Pat. No. 3,625,736; microcapsule particles containing no color former described in United Kingdom Patent No. 1,235,991; and cellulose particles, and inorganic particles, such as particles of talc, kaolin, bentonite, agalmatolite, zinc oxide, titanium oxide or almina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material. The details of the image-receiving layer will be described later.

The light-sensitive material employing the heating layer is described in Japanese Patent Application No. 60(1985)-135568. Examples and usage of the other auxiliary layers are also described in the above-mentioned publications and applications concerning the light-sensitive material.

Use of the light-sensitive material employing the light-sensitive microcapsule is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Application No. 60(1985)-210657.

In the above development process, a polymer image can be formed on the light-sensitive layer. A pigment image can be also obtained by fixing pigments on the polymer image.

The image can be also formed on the image-receiving material. The image-receiving material is described hereinbelow. The image forming method employing the image-receiving material or the image-receiving layer is described in Japanese Patent Application No. 60(1985)-121284.

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-sensitive layer.

The image-receiving layer can be composed of two or more layers according to the above-mentioned functions. The thickness of the image-receiving layer preferably ranges from 1 to 100 μm, more preferably from 1 to 20 μm.

After the development process of pressing the light-sensitive material in contact with the image-receiving material to transfer the polymerizable compounds which is still polymerizable to the image-receiving material, a polymer image can be obtained in the image-receiving material. The process for pressing can be carried out by various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 3 l of water were dissolved 40 g of gelatin and 23.8 g of potassium bromide and the resulting gelatin solution was kept at 50° C. To the gelatine solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 ml.

Preparation of light-sensitive composition

In 100 g of trimethylolpropane triacrylate were dissolved 0.20 g of following copolymer (P-30) and 6.00 g of Pargascript Red I-6-B (produced by Chiba Geigy).

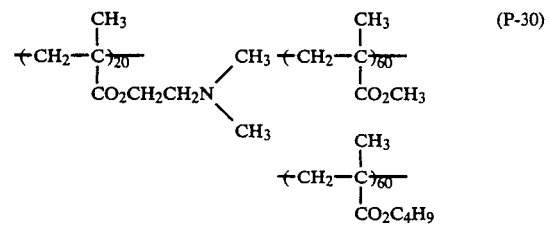

To the solution was added a solution in which 0.61 g of following reducing agent (I) and 1.22 g of following reducing agent (II) are dissolved in 1.80 g of methylene chloride.

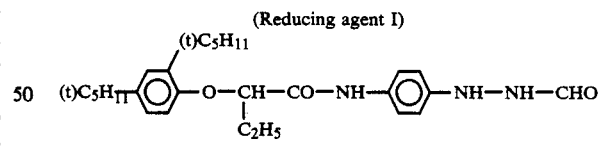

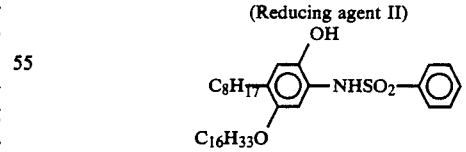

Further, to the resulting solution was added 4.06 g of silver halide emulsion and the mixture was stirred at 15,000 r.p.m. for 5 minutes to obtain a light-sensitive composition.

Preparation of light-sensitive microcapsule

To 10.51 g of a 18.6% aqueous solution of Isovan (produced by Kuraray Co., Ltd.) was added 48.56 g of a 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To the aqueous emulsion were added 72.5 g of a 40% aqueous solution of urea, 2.82 g of a 11.3% aqueous solution of resorcinol, 8.56 g of a 37% aqueous solution of formaldehyde, and 2.74 g of a 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of a 30.9% aqueous solution of sodium hydrogen sulfite was added to the mixture to obtain a dispersion of a light-sensitive microcapsule.

Preparation of light-sensitive material

To 10.0 g of the dispersion of light-sensitive microcapsule1 were added 1.0 g of a 10% aqueous solution of Emulex NP-8 (tradename, preduced by Nippon Emulsion Co., Ltd.) and 3.69 g of a 10% solution (solvent: water/ethanol=50/50 as volume ratio) of guanidine trichroloacetate to prepare a coating solution. The coating solution was coated on the polyethyleneterephthalate film (thickness: 100 μm) using a coating rod of #80 and dried at about 40° C. to obtain a light-sensitive material.

Preparation of image-receiving material

To 125 g of water was added 11 g of a 40% aqueous solution of sodium hexametaphosphate, and were further added 34 g of zinc 3,5-di-α-methylbenzylsalicylate and 82 g of a 55% slurry of calcium carbonate, followed by coarsely dispersing in a mixer. The coarse dispersion was then finely dispersed in a dynamic dispersing device. To 200 g of the resulting dispersion were added 6 g of a 50% latex of SBR (styrene-butadiene rubber) and 55 g of a 8% aqueous solution of polyvinyl alcohol, and the resulting mixture was made uniform.

The mixture was then uniformly coated on an art paper having a basis weight of 43 g/m$^2$ to a wet thickness of 30 μm and dried to obtain an image-receiving material.

Evaluation of light-sensitive material

The light-sensitive material was imagewise exposed to light using a tungsten lamp at 2,000 lux for 1 second and then heated on a hot plate at 125° C. for 40 seconds. The exposed and heated light-sensitive material was then brought into contact with the image-receiving material and passed through press rolls under pressure of 350 kg/cm$^2$ to obtain a clear magenta positive image on the image receiving element. The density of the obtained image was measured using Macbeth reflection densitometer. As the result, the maximum density was 1.40 and the minimum density was 0.05. It is apparent from the result that a clear image having high ratio of the maximum density to the minimum density is obtained.

Further, the amount of silver halide transferred to the image-receiving material was measured using X-ray fluorescence analysis. As the result, the amount of silver halide was under 1 mg/m$^2$. It is apparent from the result that substantially no silver halide was transferred.

EXAMPLE 2

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excess salts were dedimented and removed from the resulting emulsion by pH-adjustment. Thereafter, the emulsion was adjusted to a pH of 6.30 to obtain a silver benzotriazole emulsion. The yield of the emulsion was 400 g.

Preparation of light-sensitive composition

A light-sensitive composition was prepared in the same manner as in Example 1 except that 4.00 g of Cristal Violet Lactone was used in place of 6.00 g of Pargascript Red, that 0.61 g of following reducing agent (III) was used in place of 0.61 g of reducing agent (I), and that 3.35 g of the silver benzotriazole emulsion was added immediately after the addition of the silver halide emulsion.

(Reducing agent III)

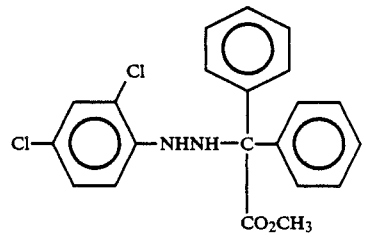

Preparation of light-sensitive microcapsule

A dispersion of light-sensitive microcapsule was prepared in the same manner as in Example 1 except that the above light-sensitive composition was used.

Preparation of light-sensitive material

A light-sensitive microcapsule was prepared in the same manner as in Example 1 except that the above light-sensitive microcapsule was used.

Evaluation of light-sensitive material

The light-sensitive material was evaluated in the same manner as in Example 1 to obtain a clear blue positive image on the image receiving element. The density of the obtained image was measured using Macbeth reflection densitometer. As the result, the maximum density was 1.50 and the minimum density was 0.05.

EXAMPLE 3

Preparation of light-sensitive composition

A light-sensitive composition was prepared in the same manner as in Example 1 except that 0.6 ml of a 0.04% methanol solution of the following dye was added to 4.06 g of the silver halide emulsion in Example 1 and stirred for 5 minutes, and the resulting emulsion was used in place of the silver halide emulsion in Example 1.

(Dye)

[Structure: bis-benzoxazole cyanine dye with ethyl-substituted trimethine bridge, N-CH₂CH₂SO₃⁻ groups, and HN⁺ counterion with phenyl group]

Preparation of light-sensitive microcapsule

A dispersion of light-sensitive microcapsule was prepared in the same manner as in Example 1 except that the above light-sensitive composition was used.

Preparation of light-sensitive material

A light-sensitive microcapsule was prepared in the same manner as in Example 1 except that the above light-sensitive microcapsule was used.

Evaluation of light-sensitive material

The light-sensitive material was exposed to light through green filter in which the density was continuously changing, using a tungsten lamp at 2,000 lux for 1 second and then heated on a hot plate at 125° C. for 40 seconds. The exposed and heated light-sensitive material was then brought into contact with the image-receiving material and passed through press rolls under pressure of 350 kg/cm² to obtain a clear magenta positive image on the image receiving element. The density of the obtained image was measured using Macbeth reflection densitometer. As the result, the maximum density was 1.40 and the minimum density was 0.05.

EXAMPLE 4

Preparation of light-sensitive composition

A light-sensitive composition was prepared in the same manner as in Example 1 except that 0.40 g of copolymer (P-30) was used in place of 0.20 g of the copolymer, that 0.61 g of reducing agent (III) in Example 2 was used in place of 0.61 g of reducing agent (I), and that 3.35 g of the silver benzotriazole emulsion in Example 2 was added immediately after the addition of the silver halide emulsion.

Preparation of light-sensitive microcapsule

A dispersion of light-sensitive microcapsule was prepared in the same manner as in Example 1 except that the above light-sensitive composition was used.

Preparation of light-sensitive material

A light-sensitive microcapsule was prepared in the same manner as in Example 1 except that the above light-sensitive microcapsule was used.

Evaluation of light-sensitive material

The light-sensitive material was evaluated in the same manner as in Example 1 to obtain a clear magenta positive image on the image receiving element. The density of the obtained image was measured using Macbeth reflection densitometer. The results will be set forth in Table 1.

EXAMPLE 5

Preparation of light-sensitive composition

Light-sensitive compositions were prepared in the same manner as in Example 4 except that 0.40 g of each of the following polymers was used in place of 0.40 g of copolymer (P-30).

(P-14): $-(CH_2-C(CH_3))_{20}-/CH_3-(CH_2-C(CH_3))_{80}-$ with $CO_2CH_2CH_2N(CH_3)_2$ and $CO_2C_2H_5$ (P-19): $-(CH_2-C(CH_3))_{20}-/CH_3-(CH_2-C(CH_3))_{80}-$ with $CO_2CH_2CH_2N(CH_3)_2$ and $CO_2C_4H_9$ (P-25): $-(CH_2-C(CH_3))_{20}-/CH_3-(CH_2-C(CH_3))_{80}-$ with $CO_2CH_2CH_2N(CH_3)_2$ and $CO_2$–cyclohexyl(H)

(P-26): $-(CH_2-C(CH_3))_{20}-$ $-(CH_2-C(CH_3))_{80}-$ with $CO_2CH_2CH_2OH$ and $CO_2C_2H_5$ (S-1): $-(CH_2-C(CH_3))_{60}-$ $-(CH_2-C(CH_3))_{40}-$ with $CO_2CH_3$ and $CO_2C_4H_9$ (S-2): $-(CH_2-C(CH_3))-$ with $CO_2C_4H_9\text{-}i$ The compounds of S-1 and S-2 were tested for comparison.

Preparation of light-sensitive microcapsule

Dispersions of light-sensitive microcapsule were prepared in the same manner as in Example 1 except that the above light-sensitive compositions were used.

Preparation of light-sensitive material

Light-sensitive microcapsules were prepared in the same manner as in Example 1 except that the above light-sensitive microcapsules were used.

Evaluation of light-sensitive material

The light-sensitive materials were evaluated in the same manner as in Example 1 to obtain magenta positive images on the image receiving elements. The density of the obtained image was measured using Macbeth reflection densitometer. The results are set forth in Table 1.

TABLE 1

| Polymer | Reflection Density | |
|---|---|---|
| | Maximum Density | Minimum Density |
| P-30 | 1.34 | 0.11 |
| P-14 | 1.22 | 0.10 |
| P-19 | 1.29 | 0.07 |
| P-25 | 1.31 | 0.09 |
| P-26 | 1.27 | 0.09 |
| S-1 | 1.21 | 0.54 |
| S-2 | 1.20 | 0.49 |

EXAMPLE 6

Preparation of light-sensitive composition

Light-sensitive compositions were prepared in the same manner as in Examples 4 and 5 except that 0.6 ml of a 0.04% methanol solution of the dye in Example 3 was added to 4.06 g of the silver halide emulsion in Example 4 and 5, and stirred for 5 minutes. The resulting emulsion was used in place of the silver halide emulsion in Example 4 and 5.

Preparation of light-sensitive microcapsule

Dispersions of light-sensitive microcapsule were prepared in the same manner as in Example 1 except that the above light-sensitive compositions were used.

Preparation of light-sensitive material

Light-sensitive microcapsules were prepared in the same manner as in Example 1 except that the above light-sensitive microcapsules were used.

Evaluation of light-sensitive material

The light-sensitive materials were evaluated in the same manner as in Example 3 to obtain magenta positive images on the image receiving elements. The density of the obtained image was measured using Macbeth reflection densitometer. The results are set forth in Table 2.

TABLE 2

| Polymer | Reflection Density | |
|---|---|---|
| | Maximum Density | Minimum Density |
| P-30 | 1.27 | 0.13 |
| P-14 | 1.19 | 0.15 |
| P-19 | 1.23 | 0.20 |
| P-25 | 1.26 | 0.17 |
| P-26 | 1.26 | 0.13 |
| S-1 | 1.20 | 0.64 |
| S-2 | 1.18 | 0.60 |

As described hereinbefore, the specific polymer employable in the present invention is a polymer having a principal chain consisting essentially of a hydrocarbon chain substituted in part with hydrophilic groups which contain, in their terminal groups, —OH or nitrogen having a lone electron-pair.

The following gives additional examples of the repeating units that can constitute the above-mentioned polymer of the invention.

The repeating units in the polymer can be repeating units having a hydrophilic group which has the formula (IV):

in which each of $R^{11}$, $R^{12}$ and $R^{13}$ individually is a monovalent group selected from the group consisting of hydrogen, methyl and —$CH_2CO_2R^{14}$ ($R^{14}$ is a monovalent group selected from the group consisting of hydrogen, an alkyl group containing 1–6 carbon atoms, an aryl group containing 6–10 carbon atoms and an aralkyl group containing 7–20 carbon atoms); $L^1$ is a divalent group selected from the group consisting of an alkylene group, an arylene group, an aralkylene group, —$CO_2$—$R_{15}$— ($R^{15}$ is a divalent group selected from the group consisting of an alkylene group, an arylene group and an aralkylene group) and —CO—$NR^{16}$—$R^{17}$ (each of $R^{16}$ and $R^{17}$ has the same meaning as that of $R^{14}$ and $R^{15}$, respectively); m is 0 or 1; and $Q^3$ is a monovalent group selected from the group consisting of hydroxyl, —$NR^{18}R^{19}$, —$CONR^{18}R^{19}$, —$NR^{18}COR^{19}$, —$SO_2NR^{18}R^{19}$, —$NR^{18}SO_2R^{19}$ (each of $R^{18}$ and $R^{19}$ individually is hydrogen, an alkyl group and a substituted alkyl group, and $R^{18}$ and $R^{19}$ totally contains not more than 5 carbon atoms, or $R^{18}$ and $R^{19}$ together with the invervening atom or atoms form 5- or 6-membered nitrogen-containing heterocyclic group), and a 5- or 6-membered nitrogen-containing heterocyclic group.

The repeating units in the polymer can be repeating units having a hydrophilic group which has the formula (V):

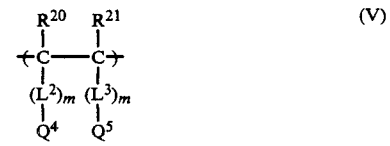

in which each of $R^{20}$ and $R^{21}$ individually has the same meaning as that of $R^{11}$; $L^2$ is —$CO_2$—$R_{15}$— or —CO—$NR^{16}$—$R^{17}$; $L^3$ has the same meaning as that of L; m is 0 or 1; and each of $Q^4$ and $Q^5$ has the same meaning as that of $Q^3$.

The repeating units in the polymer can be repeating units having a hydrophilic group which has the formula (VI):

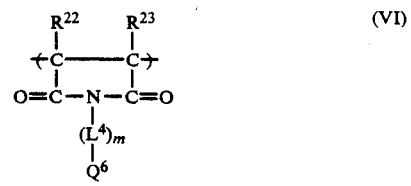

in which each of $R^{22}$ and $R^{23}$ individually has the same meaning as that of $R^{11}$; $L^4$ has the same meaning as that of $L^1$; m is 0 or 1; and $Q^6$ has the same meaning as that of $Q^3$.

We claim:

1. A light-sensitive element comprising a support and a light-sensitive layer containing silver halide, a polymerizable compound having an ethylenic unsaturated group, a reducing agent having a function of reducing the silver halide or a function of accelerating or restraining polymerization of the polymerizable compound, and a binder, said silver halide being contained in the light-sensitive layer in such an amount that the total silver content is in the range of from 0.1 mg/m$^2$ to 10 g/m$^2$, said polymerizable compound being contained in the light-sensitive layer in an amount of from 5 to $1.2 \times 10^5$ times by weight as much as the amount of silver halide, and said reducing agent being contained in the light-sensitive layer in an amount of from 0.1 to 1,500 mole % based on the amount of silver, wherein the silver halide and polymerizable compound are contained in microcapsules which are dispersed in the light-sensitive layer, said polymerizable compound being arranged as a core material of the microcapsule, and a shell material of the microcapsules containing the silver halide under the condition that the core material contains silver halide in an amount of not more than 30% by weight of the amount of the silver halide in the shell material.

2. The light-sensitive element as claimed in claim 1, wherein the core material of the microcapsules further contains the reducing agent.

3. The light-sensitive element as claimed in claim 1, wherein the core material of the microcapsules further contains a color image forming substance.

4. The light-sensitive element as claimed in claim 3, wherein the color image forming substance is contained in the core material in an amount of from 0.5 to 20 parts by weight per 100 parts by weight of the polymerizable compound.

5. The light-sensitive element as claimed in claim 1, wherein the microcapsule has a particle size of from 0.5 to 50 μm.

6. The light-sensitive element as claimed in claim 1, wherein the silver halide is in the form of grains having a mean size of from 0.001 to 5 μm.

7. The light-sensitive element as claimed in claim 1, wherein the microcapsule further contains a polymer having a principal chain consisting essentially of a hydrocarbon chain substituted in part with hydrophilic groups which contain, in their terminal groups, —OH or nitrogen having a lone electron-pair.

8. The light-sensitive element as claimed in claim 1, wherein the shell material contains the silver halide under the condition that the core material contains silver halide in an amount of not more than 10% by weight of the amount of the silver halide in the shell material.

* * * * *